(12) United States Patent
Qian

(10) Patent No.: US 10,930,896 B2
(45) Date of Patent: Feb. 23, 2021

(54) PACKAGE METHOD OF OLED ELEMENT AND OLED PACKAGE STRUCTURE

(71) Applicant: TCL China Star Optoelectronics Technology Co., Ltd., Guangdong (CN)

(72) Inventor: Jiajia Qian, Shenzhen (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 16/996,842

(22) Filed: Aug. 18, 2020

(65) Prior Publication Data
US 2020/0381676 A1 Dec. 3, 2020

Related U.S. Application Data

(62) Division of application No. 15/105,573, filed on Jun. 17, 2016, now Pat. No. 10,784,468.

(30) Foreign Application Priority Data

Mar. 17, 2016 (CN) .......................... 201610154164.9

(51) Int. Cl.
*H01L 51/56* (2006.01)
*H01L 51/52* (2006.01)
*H01L 27/32* (2006.01)

(52) U.S. Cl.
CPC .......... *H01L 51/56* (2013.01); *H01L 27/3241* (2013.01); *H01L 51/524* (2013.01); *H01L 51/5253* (2013.01); *H01L 51/5256* (2013.01)

(58) Field of Classification Search
CPC ....... H01L 51/524–525; H01L 51/5253; H01L 51/5256; H01L 51/56; H01L 27/3241
See application file for complete search history.

(56) References Cited

U.S. PATENT DOCUMENTS

2014/0217371 A1* 8/2014 Kim .................... H01L 51/5256
257/40

* cited by examiner

*Primary Examiner* — Hoang-Quan Ho
(74) *Attorney, Agent, or Firm* — Leong C. Lei

(57) ABSTRACT

The present invention provides a package method of an OLED element and an OLED package structure. In the package method of the OLED element, according to the present invention, by manufacturing a circle of the retaining wall at the periphery of the OLED element, and then forming the laminated film covering the OLED element in the region surrounded by the retaining wall, and the laminated film comprises the few first barrier layers and the few buffer layers which are alternately stacking, and ultimately, forming the second barrier layer which completely covers the buffer layer and the top of the retaining wall on the outermost buffer layer of the laminated film, the OLED package structure of extremely strong sealing can be obtained. In the package method, a protective shield of extremely strong sealing for the OLED element is formed with the retaining wall and the outermost second barrier layer.

4 Claims, 4 Drawing Sheets

PACKAGE METHOD OF OLED ELEMENT AND OLED PACKAGE STRUCTURE

CROSS REFERENCE TO RELATED APPLICATION

This is a divisional application of co-pending U.S. patent application Ser. No. 15/105,573, filed on Jun. 17, 2016, which is a national stage of PCT Application No. PCT/CN2016/080281, filed on Apr. 26, 2016, claiming foreign priority of Chinese Patent Application No. 201610154164.9, filed on Mar. 17, 2016.

FIELD OF THE INVENTION

The present invention relates to a display technology field, and more particularly to a package method of an OLED element and an OLED package structure.

BACKGROUND OF THE INVENTION

An OLED is an Organic Light Emitting Diodes Display possessing properties of self-illumination, high brightness, wide view angle, high contrast, flexibility and low power consumption, etc., and accordingly has been received more attentions. As being the display of next generation, it has been gradually replaced traditional LCD (Liquid Crystal Display) and widely applied in cellular phone screens, computer displays, full color TV, etc.

The package is a crucially important link of the OLED element manufacture process. Because the components, such as the water and the oxygen in the air has huge influence to the organic material in the OLED structure, the package quality directly affects the sealing, and results in the significant change of the usage lifetime and the quality of the product. Therefore, the package skill is the important technology of determining the OLED element quality.

At present, the package of the OLED element mainly utilizes the hard package substrate (such as glass or metal) for packaging with the package seal. However, the method is not suitable for the flexible element. Therefore, in other solutions, the laminated film (the barrier layer of great water resistance and the buffer layer of good flexibility) is used for package. FIG. 1 is a diagram of an OLED package structure according to prior art. As shown in FIG. 1, the OLED package structure comprises a TFT substrate 100, an OLED element 200 located on the TFT substrate 100, a several layers of barrier layers 300, which are alternately stacking up, located on the OLED element 200 and the TFT substrate 100 and a buffer layer 400. The function of the barrier layers 300 is to prevent the invasion of the water and the oxygen. The function of the buffer layer 400 is to increase the permeability channel length and to release the stresses among the barrier layers 300, and the layer has function of covering the unavoidable particle and does not has water resistance mechanism itself; therefore, the barrier layers 300 must be larger than the buffer layer 400 and completely covers the same, and otherwise, the water and vapor can invade through the buffer layer 400 to lead to the performance degradation of the package structure. In the aforesaid OLED package structure, the sizes of the barrier layers 300 and the buffer layer 400 are different, and different masks are utilized for manufacture. Thus, the utilized amount of the masks in the manufacture process of the OLED package structure is more and the manufacture process is complicated, and the production cost is higher. Meanwhile, the tightness of the manufactured OLED package structure is poor, in which the water and oxygen can easily permeate to result in the faster performance degradation of the OLED element, and the lifetime is shortened.

Therefore, there is a need to provide a package method of an OLED element and an OLED package structure for solving the aforesaid issues.

SUMMARY OF THE INVENTION

An objective of the present invention is to provide an OLED package method, capable of simplifying the package process, and forming the package of extremely strong sealing to the OLED element, and thus to prevent the invasion of the water and the vapor for promoting the performance of the OLED element and extending the usage lifetime of the OLED element.

Another objective of the present invention is to provide an OLED package structure, of which the manufacture process is simple and the sealing is extremely strong to promote the performance of the OLED element and to extend the usage lifetime of the OLED element.

For realizing the aforesaid objective, the present invention provides a package method of an OLED element, comprising steps of:

step 1, providing a TFT substrate, and forming an OLED element and a circle of retaining wall at a periphery of the OLED element on the TFT substrate;

step 2, forming a first barrier layer covering the OLED element in a region surrounded by the retaining wall on the TFT substrate, and forming a buffer layer on the first barrier layer;

step 3, repeating operation of the step 2 with few times until an upper surface of the outermost buffer layer is close to or even with a top surface of the retaining wall, and thus to obtain a laminated thin film which is constructed by alternately stacking the few first barrier layers and the few buffer layers;

step 4, forming a second barrier layer on the laminated thin film, wherein the second barrier layer completely covers the laminated thin film and a top of the retaining wall to accomplish package to the OLED element.

The specific implementation of the step 1 comprises steps of:

step 11, providing the TFT substrate, and forming the OLED element on the TFT substrate with evaporation;

step 12, arranging a forming region of the retaining wall on the TFT substrate, and employing a mask to shelter other regions except the forming region on the TFT substrate, and depositing inorganic material on the TFT substrate with low temperature plasma enhanced chemical vapor deposition or atomic layer deposition, and forming the circle of the retaining wall at the periphery of the OLED element.

The specific implementation of the step 1 comprises steps of:

step 11', depositing inorganic material on the TFT substrate with low temperature plasma enhanced chemical vapor deposition or atomic layer deposition to form an inorganic material layer covering the TFT substrate, and employing one photolithographic process to pattern the inorganic material layer to obtain the circle of the retaining wall at the periphery of the TFT substrate;

step 12', forming the OLED element in the region surrounded by the retaining wall on the TFT substrate with evaporation.

In the step 2 and the step 3, a method of forming the first barrier layer is: arranging a forming region of the first barrier layer on the TFT substrate, and employing a mask to shelter other regions except the forming region on the TFT substrate, and depositing inorganic material on the TFT substrate with low temperature plasma enhanced chemical vapor deposition or atomic layer deposition to form the first barrier layer.

In the step 2 and the step 3, a manufacture method of the buffer layer is: arranging a forming region of the buffer layer on the TFT substrate, and employing a mask to shelter other regions except the forming region of the TFT substrate, and depositing organic material on the TFT substrate with printing, evaporation or plasma enhanced chemical vapor deposition to form the buffer layer.

Both an area of the first barrier layer and an area of the buffer layer are equal to an area of the region surrounded by the retaining wall on the TFT substrate.

The present invention further provides an OLED package structure, comprising a TFT substrate, an OLED element located on the TFT substrate, a circle of retaining wall located on the TFT substrate and at a periphery of the OLED element, a laminated thin film being located in a region surrounded by the retaining wall on the TFT substrate and covering the OLED element and a second barrier layer completely covering the laminated thin film and a top of the retaining wall;

the laminated thin film comprises the few first barrier layers and the few buffer layers, wherein the first barrier layers and the buffer layers are alternately located, and a first layer of thin films in the laminated thin film which directly covers the OLED element is the first barrier layer, and the outermost layer of thin films in the laminated thin film is the buffer layer.

An upper surface of the outermost buffer layer in the laminated thin film is close to or even with a top surface of the retaining wall.

Both an area of the first barrier layer and an area of the buffer layer are equal to an area of the region surrounded by the retaining wall on the TFT substrate.

Material of the retaining wall, the first barrier layer and the second barrier layer is inorganic material; material of the buffer layer is organic material.

The present invention further provides a package method of an OLED element, comprising steps of:

step 1, providing a TFT substrate, and forming an OLED element and a circle of retaining wall at a periphery of the OLED element on the TFT substrate;

step 2, forming a first barrier layer covering the OLED element in a region surrounded by the retaining wall on the TFT substrate, and forming a buffer layer on the first barrier layer;

step 3, repeating operation of the step 2 with few times until an upper surface of the outermost buffer layer is close to or even with a top surface of the retaining wall, and thus to obtain a laminated thin film which is constructed by alternately stacking the few first barrier layers and the few buffer layers;

step 4, forming a second barrier layer on the laminated thin film, wherein the second barrier layer completely covers the laminated thin film and a top of the retaining wall to accomplish package to the OLED element;

wherein in the step 2 and the step 3, a method of forming the first barrier layer is: arranging a forming region of the first barrier layer on the TFT substrate, and employing a mask to shelter other regions except the forming region on the TFT substrate, and depositing inorganic material on the TFT substrate with low temperature plasma enhanced chemical vapor deposition or atomic layer deposition to form the first barrier layer;

wherein in the step 2 and the step 3, a manufacture method of the buffer layer is: arranging a forming region of the buffer layer on the TFT substrate, and employing a mask to shelter other regions except the forming region of the TFT substrate, and depositing organic material on the TFT substrate with printing, evaporation or plasma enhanced chemical vapor deposition to form the buffer layer.

The benefits of the present invention are: the present invention provides a package method of an OLED element and an OLED package structure. By manufacturing a circle of the retaining wall at the periphery of the OLED element, and then forming the laminated film covering the OLED element in the region surrounded by the retaining wall, and the laminated film comprises the few first barrier layers and the few buffer layers which are alternately stacking, and ultimately, forming the second barrier layer which completely covers the buffer layer and the top of the retaining wall on the outermost buffer layer of the laminated film, the OLED package structure of extremely strong sealing can be obtained to prevent the invasion of the water and the vapor for promoting the performance of the OLED element and extending the usage lifetime of the OLED element. In the package method, a protective shield of extremely strong sealing for the OLED element is formed with the retaining wall and the outermost second barrier layer. Thus, as manufacturing the laminated film inside the retaining wall, it does not have to be considered that the area of the first barrier layer must be larger than the area of the buffer layer. Therefore, the first barrier layer and the buffer layer can be manufactured with the same mask. The amount of the masks is decreased and the package process is simplified, and thus the production cost is reduced.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
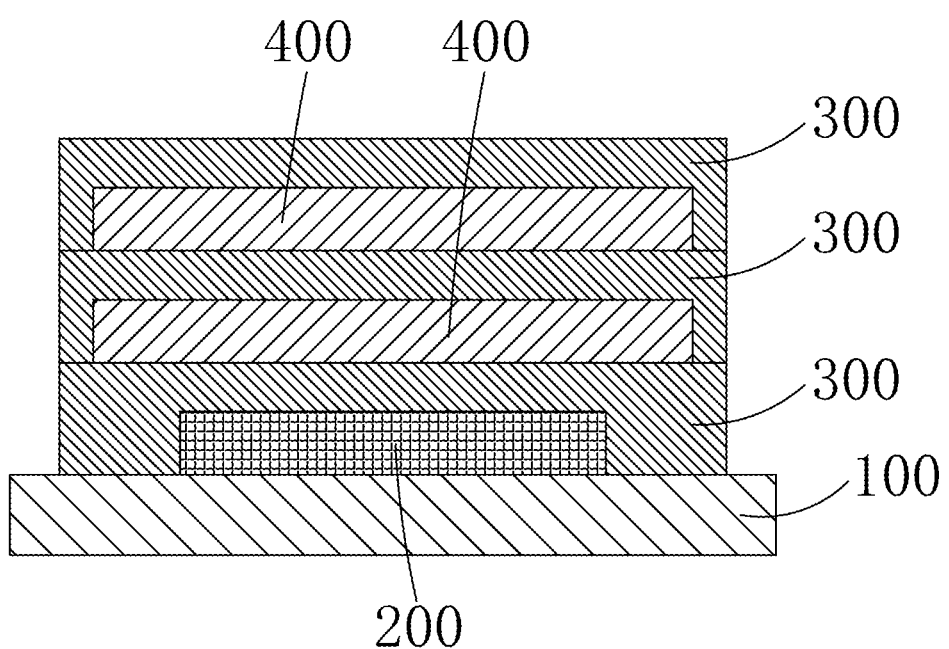
FIG. 1 is a diagram of an OLED package structure according to prior art.
Figure 2:
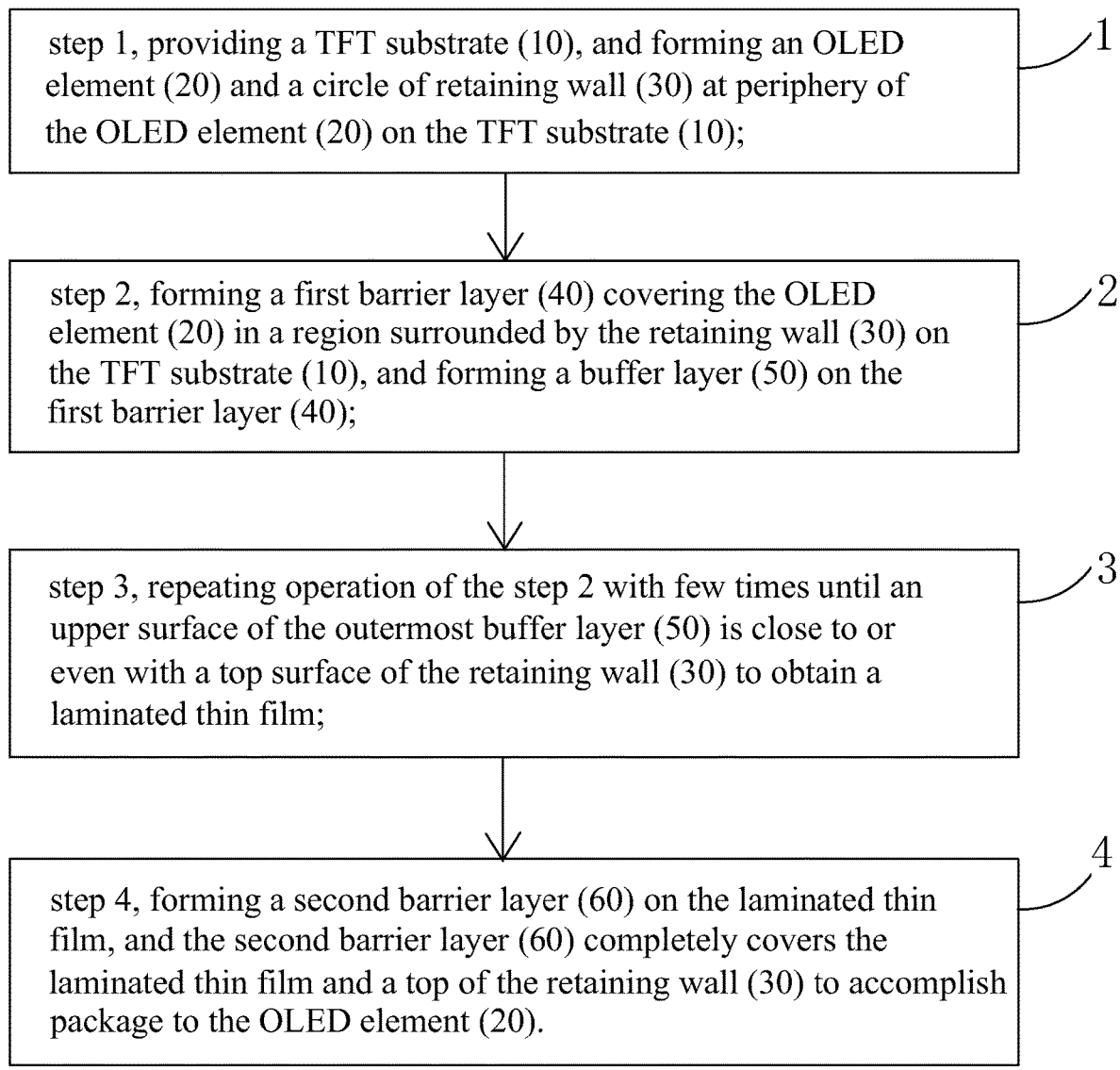
FIG. 2 is a flowchart of a package method of an OLED element according to the present invention.
Figure 3:
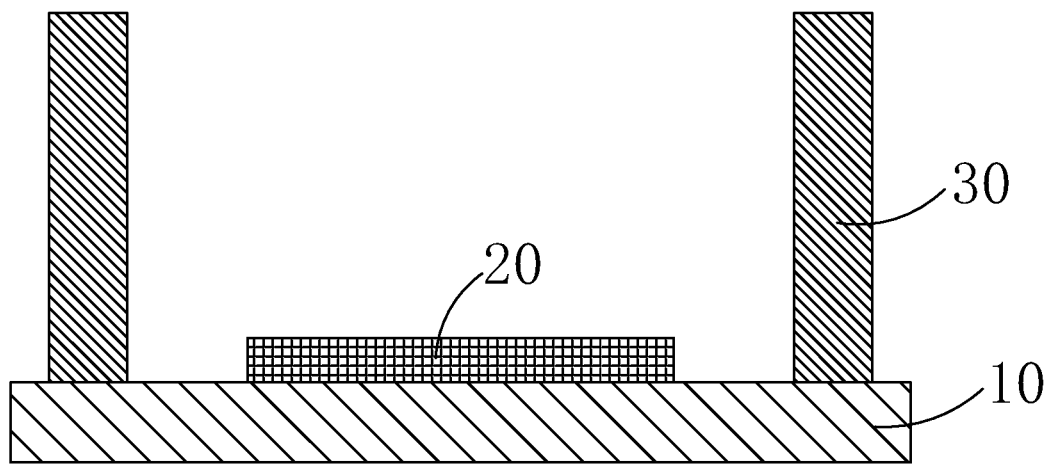
FIG. 3 is a diagram of the step 1 in a package method of an OLED element according to the present invention.

Please refer to FIG. 2. The present invention provides a package method of an OLED element, comprising steps of:

step 1, as shown in FIG. 3, providing a TFT substrate 10, and forming an OLED element 20 and a circle of retaining wall 30 at periphery of the OLED element 20 on the TFT substrate 10.

Specifically, the specific implementation of the step 1 can comprise steps of:

step 11, providing the TFT substrate 10, and forming the OLED element 20 on the TFT substrate 10 with evaporation;

step 12, arranging a forming region of the retaining wall on the TFT substrate 10, and employing a mask to shelter other regions except the forming region on the TFT substrate 10, and depositing inorganic material on the TFT substrate 10 with low temperature (PECVD) plasma enhanced chemical vapor deposition or ALD (atomic layer deposition), and forming the circle of retaining wall 30 at the periphery of the OLED element 20.

Figure 4:
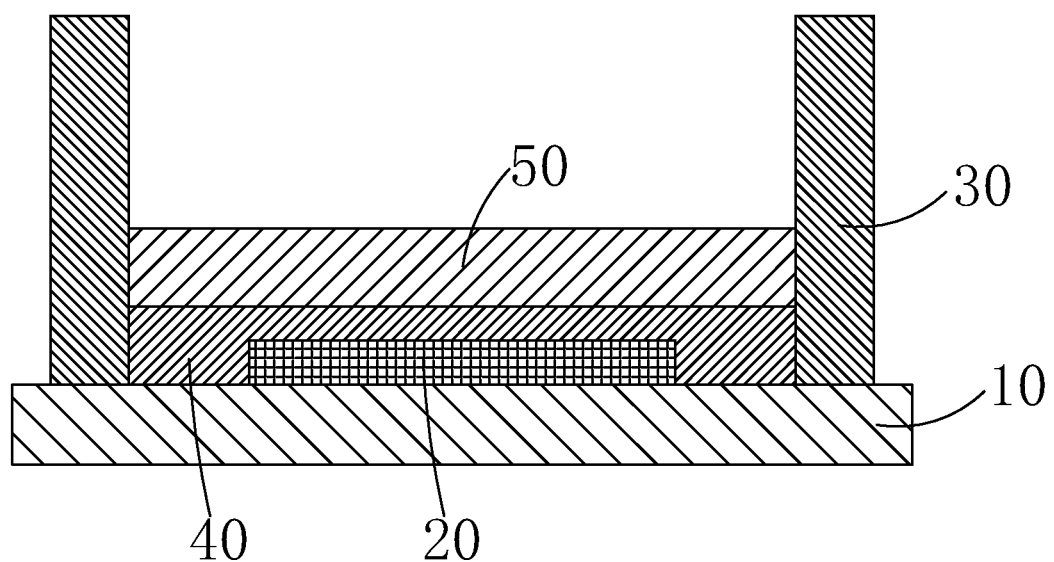
FIG. 4 is a diagram of the step 2 in a package method of an OLED element according to the present invention.
Figure 5:
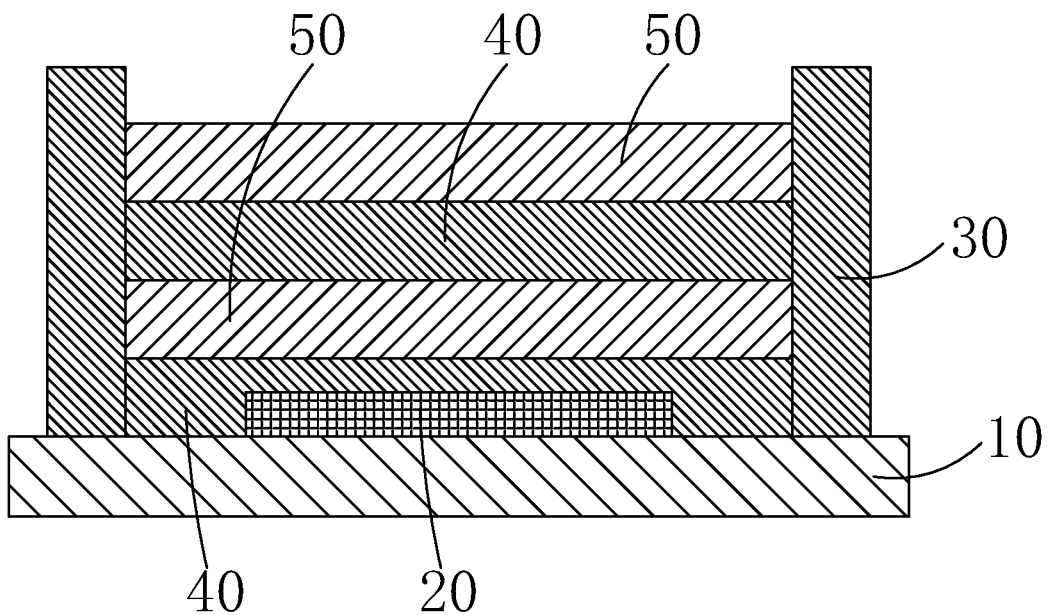
FIG. 5 is a diagram of the step 3 in a package method of an OLED element according to the present invention.

Or, the specific implementation of the step 1 also can comprise steps of:

step 11', depositing inorganic material on the TFT substrate 10 with low temperature plasma enhanced chemical vapor deposition or atomic layer deposition to form an inorganic material layer covering the TFT substrate 10, and employing one photolithographic process to pattern the inorganic material layer to obtain the circle of the retaining wall 30 at the periphery of the TFT substrate 10;

step 12', forming the OLED element 20 in the region surrounded by the retaining wall 30 on the TFT substrate 10 with evaporation.

step 2, as shown in FIG. 4, forming a first barrier layer 40 covering the OLED element 20 in a region surrounded by the retaining wall 30 on the TFT substrate 10, and forming a buffer layer 50 on the first barrier layer 40.

step 3, as shown in FIG. 5, repeating operation of the step 2 with few times until an upper surface of the outermost buffer layer 50 is close to or even with a top surface of the retaining wall 30, and thus to obtain a laminated thin film which is constructed by alternately stacking the few first barrier layers 40 and the few buffer layers 50.

Specifically, in the step 2 and the step 3, a method of forming the first barrier layer 40 is: arranging a forming region of the first barrier layer on the TFT substrate 10, and employing a mask to shelter other regions except the forming region on the TFT substrate 10, and depositing inorganic material on the TFT substrate 10 with low temperature plasma enhanced chemical vapor deposition or atomic layer deposition to form the first barrier layer 40.

Specifically, in the step 2 and the step 3, a manufacture method of the buffer layer 50 is: arranging a forming region of the buffer layer 50 on the TFT substrate 10, and employing a mask to shelter other regions except the forming region on the TFT substrate 10, and depositing organic material on the TFT substrate 10 with printing, evaporation or plasma enhanced chemical vapor deposition to form the buffer layer 50.

Figure 6:
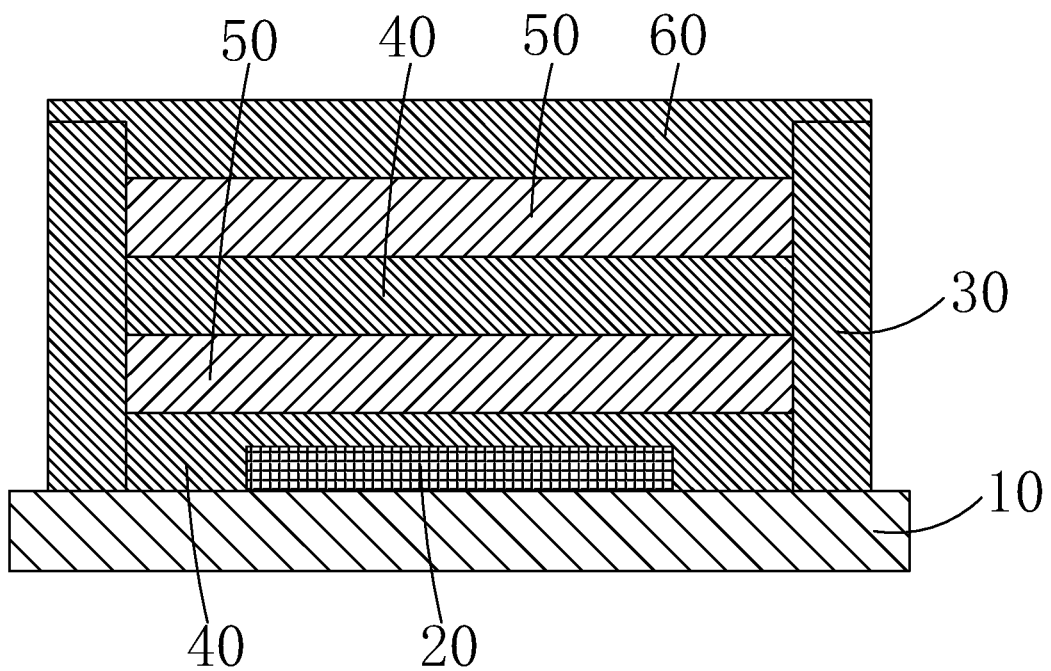
FIG. 6 is a diagram of the step 4 in a package method of an OLED element according to the present invention and also a diagram of an OLED package structure according to the present invention.

Preferably, both an area of the first barrier layer 40 and an area of the buffer layer 50 are equal to an area of the region surrounded by the retaining wall 30 on the TFT substrate 10. Thus, the laminated film is filled in the space surrounded by the retaining wall 30 above the TFT substrate 10 for forming the package and protection of extremely strong sealing to the OLED element 20. Because the area of the first barrier layer 40 and the area of the buffer layer 50 are equal, the first barrier layer 40 and the buffer layer 50 can be manufactured with the same mask for saving the production cost.

step 4, as shown in FIG. 6, forming a second barrier layer 60 on the outermost buffer layer 50 of the laminated thin film, and the second barrier layer 60 completely covers the outermost buffer layer 50 of the laminated thin film and a top of the retaining wall 30 to accomplish package to the OLED element 20.

Specifically, the manufacture method of the second barrier layer 60 and the manufacture method of the first barrier layer 40 are basically the same. The difference is the utilized masks are different.

Preferably, material of the retaining wall 30, the first barrier layer 40 and the second barrier layer 60 is inorganic material, such as silicon nitride ($SiN_x$) or aluminum oxide ($Al_2O_3$); material of the buffer layer 50 is acrylic resin or organic material containing silicon.

Please refer to FIG. 6. The present invention further provides an OLED package structure, comprising a TFT substrate 10, an OLED element 20 located on the TFT substrate 10, a circle of retaining wall 30 located on the TFT substrate 10 and at a periphery of the OLED element 20, a laminated thin film being located in a region surrounded by the retaining wall 30 on the TFT substrate 10 and covering the OLED element 20 and a second barrier layer 60 completely covering the laminated thin film and a top of the retaining wall 30;

the laminated thin film comprises the few first barrier layers 40 and the few buffer layers 50, wherein the first barrier layers 40 and the buffer layers 50 are alternately located, and a first layer of thin films in the laminated thin film which directly covers the OLED element 20 is the first barrier layer 40, and the outermost layer of thin films in the laminated thin film is the buffer layer 50.

Specifically, an upper surface of the outermost buffer layer 50 in the laminated thin film is close to or even with a top surface of the retaining wall 30.

Preferably, both an area of the first barrier layer 40 and an area of the buffer layer 50 are equal to an area of the region surrounded by the retaining wall 30 on the TFT substrate 10. Thus, the laminated film is filled in the space surrounded by the retaining wall 30 above the TFT substrate 10 for forming the package and protection of extremely strong sealing to the OLED element 20. Because the area of the first barrier layer 40 and the area of the buffer layer 50 are equal, the first barrier layer 40 and the buffer layer 50 can be manufactured with the same mask for saving the production cost.

Specifically, material of the retaining wall 30, the first barrier layer 40 and the second barrier layer 60 is inorganic material; material of the buffer layer 50 is organic material.

Preferably, material of the retaining wall 30, the first barrier layer 40 and the second barrier layer 60 is inorganic material, such as silicon nitride ($SiN_x$) or aluminum oxide ($Al_2O_3$); material of the buffer layer 50 is acrylic resin or organic material containing silicon.

In conclusion, the present invention provides a package method of an OLED element and an OLED package structure. By manufacturing a circle of the retaining wall at the periphery of the OLED element, and then forming the laminated film covering the OLED element in the region surrounded by the retaining wall, and the laminated film comprises the few first barrier layers and the few buffer layers which are alternately stacking, and ultimately, forming the second barrier layer which completely covers the buffer layer and the top of the retaining wall on the outermost buffer layer of the laminated film, the OLED package structure of extremely strong sealing can be obtained to prevent the invasion of the water and the vapor for promoting the performance of the OLED element and extending the usage lifetime of the OLED element. In the package method, a protective shield of extremely strong sealing for the OLED element is formed with the retaining wall and the outermost second barrier layer. Thus, as manufacturing the laminated film inside the retaining wall, it does not have to be considered that the area of the first barrier layer must be larger than the area of the buffer layer. Therefore, the first barrier layer and the buffer layer can be manufactured with the same mask. The amount of the masks is decreased and the package process is simplified, and thus the production cost is reduced.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An OLED package structure, comprising a TFT substrate, an OLED element located on the TFT substrate, a circle of retaining wall located on the TFT substrate and at a periphery of the OLED element, a laminated thin film comprising multiple layers including a plurality of first barrier layers and a plurality of buffer layers alternating with each other and located in a region surrounded by the retaining wall on the TFT substrate and covering the OLED element and a second barrier layer completely covering the laminated thin film and a top of the retaining wall;

wherein the plurality of first barrier layers and the plurality of buffer layers are alternately located, such that a first layer of the multiple layers in the laminated thin film which directly covers the OLED element is a first one of the plurality of first barrier layers, and an outermost layer of the multiple layers in the laminated thin film is an outermost one of the plurality of buffer layers, and wherein the retaining wall surrounds the OLED element and defines a space in which the OLED element is arranged, and wherein the laminated thin film is filled in the space such that the plurality of first barrier layers and the plurality of buffers are both confined in the spaced defined by the retaining wall and are both completely located inside the retaining wall.

2. The OLED package structure according to claim 1, wherein an upper surface of the outermost buffer layer in the laminated thin film is close to or flush with the top surface of the retaining wall.

3. The OLED package structure according to claim 1, wherein both an area of the plurality of first barrier layers and an area of the plurality of buffer layers are equal to an area of the region surrounded by the retaining wall on the TFT substrate.

4. The OLED package structure according to claim 1, wherein a material of each of the retaining wall, the plurality of first barrier layers, and the second barrier layer is an inorganic material; and a material of each of the plurality of buffer layers is an organic material.

* * * * *